US007172838B2

(12) United States Patent
Maurer et al.

(10) Patent No.: US 7,172,838 B2
(45) Date of Patent: Feb. 6, 2007

(54) CHROMELESS PHASE MASK LAYOUT GENERATION

(76) Inventors: Wilhelm Maurer, 4666 Englewood Dr., San Jose, CA (US) 95129; Juan Andres Torres Robles, C2102, Mentor Graphics Corporation, 8005 SW. Boeckman Rd., Wilsonville, OR (US) 97070; Franklin Mark Schellenberg, 4023 Villa Vista, Palo Alto, CA (US) 94306

( * ) Notice: Subject to any disclaimer, the term of this patent is extended or adjusted under 35 U.S.C. 154(b) by 259 days.

(21) Appl. No.: 10/259,373

(22) Filed: Sep. 27, 2002

(65) Prior Publication Data

US 2004/0063000 A1    Apr. 1, 2004

(51) Int. Cl.
G03F 1/00      (2006.01)
G03C 5/00      (2006.01)
(52) U.S. Cl. ............................................ 430/5; 430/30
(58) Field of Classification Search .................... 430/5, 430/30; 716/19
See application file for complete search history.

(56) References Cited

U.S. PATENT DOCUMENTS

| 4,231,811 | A | 11/1980 | Somekh et al. |
| 4,426,584 | A | 1/1984 | Bohlen et al. |
| 4,456,371 | A | 6/1984 | Lin |
| 4,812,962 | A | 3/1989 | Witt |
| 4,895,780 | A | 1/1990 | Nissan-Cohen et al. |
| 4,902,899 | A | 2/1990 | Lin et al. |
| 5,051,598 | A | 9/1991 | Ashton et al. |
| 5,182,718 | A | 1/1993 | Harafuji et al. |
| 5,208,124 | A | 5/1993 | Sporon-Fiedler et al. |
| 5,241,185 | A | 8/1993 | Meiri et al. |
| 5,242,770 | A | 9/1993 | Chen et al. |
| 5,256,505 | A | 10/1993 | Chen et al. |
| 5,316,878 | A | 5/1994 | Saito et al. |
| 5,324,600 | A | 6/1994 | Jinbo et al. |

(Continued)

FOREIGN PATENT DOCUMENTS

EP        1152289 A3    11/2001

(Continued)

OTHER PUBLICATIONS

Bauch, L. et al., "Combination of Transmission and Absorption Mask for a 0.3 μm Lithography," *SPIE 2197*:150-157, Jan. 1994.

(Continued)

Primary Examiner—S. Rosasco
(74) Attorney, Agent, or Firm—Christensen O'Connor Johnson Kindness PLLC

(57) ABSTRACT

Computer-based design and verification tools provide integrated circuit layouts for use in chromeless phase lithography. A phase-mask design tool assigns feature size descriptors to circuit layout features, and mask features are configured using the feature size descriptors. Feature size descriptors can be assigned based on feature size ranges established based on a mask error function, feature dimensions with respect to a lithographic system resolution limit, or selected properties of aerial image intensity as a function of feature size. Circuit layout features are assigned mask features that include twin phase steps. In addition, circuit layout features associated with selected feature descriptors are assigned sub-resolution assist mask pattern portions or other mask pattern portions based on optical and process corrections.

51 Claims, 9 Drawing Sheets

U.S. PATENT DOCUMENTS

| | | |
|---|---|---|
| 5,340,700 A | 8/1994 | Chen et al. |
| 5,362,591 A | 11/1994 | Imai et al. |
| 5,447,810 A | 9/1995 | Chen et al. |
| 5,472,813 A | 12/1995 | Nakagawa et al. |
| 5,498,579 A | 3/1996 | Borodovsky et al. |
| 5,553,273 A | 9/1996 | Liebmann |
| 5,553,274 A | 9/1996 | Liebmann |
| 5,573,890 A | 11/1996 | Spence |
| 5,578,402 A | 11/1996 | Watanabe |
| 5,629,113 A | 5/1997 | Watanabe |
| 5,631,110 A | 5/1997 | Shioiri et al. |
| 5,633,102 A | 5/1997 | Toh et al. |
| 5,636,002 A | 6/1997 | Garofalo |
| 5,657,235 A | 8/1997 | Liebmann et al. |
| 5,663,017 A | 9/1997 | Schinella et al. |
| 5,663,893 A | 9/1997 | Wampler et al. |
| 5,682,323 A | 10/1997 | Pasch et al. |
| 5,705,301 A | 1/1998 | Garza et al. |
| 5,707,765 A | 1/1998 | Chen |
| 5,723,233 A | 3/1998 | Garza et al. |
| 5,740,068 A | 4/1998 | Liebmann et al. |
| 5,766,806 A | 6/1998 | Spence |
| 5,815,685 A | 9/1998 | Kamon |
| 5,821,014 A | 10/1998 | Chen et al. |
| 5,825,647 A | 10/1998 | Tsudaka |
| 5,827,623 A | 10/1998 | Ishida et al. |
| 5,847,959 A | 12/1998 | Veneklasen et al. |
| 5,858,580 A * | 1/1999 | Wang et al. .................. 430/5 |
| 5,862,058 A | 1/1999 | Samuels et al. |
| 5,863,682 A | 1/1999 | Abe et al. |
| 5,879,844 A | 3/1999 | Yamamoto et al. |
| 5,882,827 A | 3/1999 | Nakao |
| 5,885,734 A | 3/1999 | Pierrat et al. |
| 5,891,596 A | 4/1999 | Choi |
| 5,900,338 A | 5/1999 | Garza et al. |
| 5,900,340 A | 5/1999 | Reich et al. |
| 5,920,487 A | 7/1999 | Reich et al. |
| 5,958,635 A | 9/1999 | Reich et al. |
| 5,972,541 A | 10/1999 | Sugasawara et al. |
| 5,991,006 A | 11/1999 | Tsudaka |
| 5,994,002 A | 11/1999 | Matsuoka |
| 6,007,310 A | 12/1999 | Jacobsen et al. |
| 6,014,456 A | 1/2000 | Tsudaka |
| 6,077,310 A | 6/2000 | Yamamoto et al. |
| 6,078,738 A | 6/2000 | Garza et al. |
| 6,081,658 A | 6/2000 | Rieger et al. |
| 6,114,071 A | 9/2000 | Chen et al. |
| 6,154,563 A | 11/2000 | Tsudaka |
| 6,168,891 B1 | 1/2001 | Shibata |
| 6,185,727 B1 | 2/2001 | Liebmann |
| 6,210,841 B1 | 4/2001 | Lin et al. |
| 6,243,855 B1 | 6/2001 | Kobayashi et al. |
| 6,249,597 B1 | 6/2001 | Tsudaka |
| 6,249,904 B1 | 6/2001 | Cobb |
| 6,269,472 B1 | 7/2001 | Garza et al. |
| 6,282,696 B1 | 8/2001 | Garza et al. |
| 6,289,499 B1 | 9/2001 | Rieger et al. |
| 6,298,473 B1 | 10/2001 | Ono et al. |
| 6,370,679 B1 | 4/2002 | Chang et al. |
| 6,584,609 B1 | 6/2003 | Pierrat et al. |
| 6,623,895 B2 | 9/2003 | Chen et al. |
| 6,901,575 B2 * | 5/2005 | Wu et al. ..................... 716/19 |
| 2003/0097647 A1 | 5/2003 | Pierrat et al. |

FOREIGN PATENT DOCUMENTS

| | | |
|---|---|---|
| GB | 2 324 169 A | 10/1998 |
| GB | 2 344 436 A | 6/2000 |
| JP | 03125150 A | 10/1989 |
| JP | 04076551 A | 7/1990 |
| JP | 04268556 | 2/1991 |
| JP | 3-80525 A | 4/1991 |
| JP | 04369823 | 6/1991 |
| JP | 3-210560 A | 9/1991 |
| JP | 8-236317 A | 9/1996 |
| JP | 9-319067 A | 12/1997 |
| JP | 10-133356 A | 5/1998 |
| JP | 11-143085 A | 5/1999 |
| WO | 99/47981 A1 | 9/1999 |
| WO | 00/67074 A1 | 11/2000 |

OTHER PUBLICATIONS

Fritze, M., et al., "Application of Chromeless Phase-Shift Masks to Sub-100 nm SOI CMOS Transistor Fabrication," *Proceedings of SPIE Optical Microlithography XIII* 4000, 2000, pp. 388-407.

Inokuchi, K., et al., "Sub-Quarter-Micron Gate Fabrication Process Using Phase-Shifting Mask for Microwave GaAs Devices," *Japanese Journal of Applied Physics*, 30(12B):3818-3821, Dec. 1991.

Jinbo, H., and Y. Yamashita, "0.2 µm Or Less i-Line Lithography By Phase-Shifting-Mask Technology," IEEE Electron Devices Meeting, Dec. 9-12, 1990, pp. 821-824.

Jinbo, H., and Y. Yamashita, "Improvement of Phase-Shifter Edge Line Mask Method," *Japanese Journal of Applied Physics* 30(11B):2998-3003, Nov. 1991.

Jinbo, H., et al., "Subhalf-Micron Patterning of Negative Working Resist by Using New Phase-Shifting Masks," *Journal of Vacuum Science Technology* B 8(6):1745-1748, Nov./Dec. 1990.

Kemp, K., et al., "Optimized Phase Shift Mask Designs for Real Devices," KTI *Microlithography Seminar*, San Jose, CA, 1991.

Kimura, T., and T. Ohshima, "Schottky Characteristics of Subhalf-Micron Gate GaAs Metal-Semiconductor Field-Effect Transistor," *Japanese Journal of Applied Physics* 32(2, 2A):L183-L186, Feb. 1993.

Lee, F. and T. Zirkle, "Process for Hybrid Phase-Shifting Mask Fabrication," *Motorola, Inc., Technical Developments*, vol. 18, Mar. 1993.

Mack, C.A., "Fundamental Issues In Phase-Shifting Mask Technology," *Proceedings of KTI Microlithography Seminar*, San Jose, California, Oct. 14-15, 1991, pp. 23-35.

Pierrat, C. and J. DeMarco, "Phase-Shifting Mask Fabrication," *SPIE 2087*:362-371, 1993.

Ronse, K., et al., "Comparison of Various Phase Shift Strategies and Application to 0.35 µm ASIC Designs," *SPIE 1927*:2-16, 1993.

Saito, T., et al., "Continuous Phase Transitions Fabricated by Subtractive Process," *SPIE 2087*:390-398, 1993.

Tanaka, T., et al., "A Novel Optical Lithography Technique Using the Phase-Shifter Fringe," *Journal of Applied Physics* 30(5):1131-1136, May 1991.

Toh, K.H., et al., "Design and Methodology for Dark-Field Phase-Shifted Masks," Proceedings of *Optical/Laser Microlithography IV SPIE 1463*:402-413, 1991.

Toh, K.H., et al., "Optical Lithography with Chromeless Phase-Shifted Masks," Proceedings of *Optical/Laser Microlithography IV SPIE 1463*:74-86, Mar. 1991.

Watanabe, H., et al., "Sub-Quarter-Micron Gate Pattern Fabrication Using A Transparent Phase Shifting Mask," *Vacuum Science Technology* B 9(6):3172-3175, Nov./Dec. 1991.

Watanabe, H., et al., "Transparent Phase Shifting Mask," IEEE Electron Devices Meeting, Dec. 9-12, 1990, pp. 821-824.

Yamada, H.T., et al., Fabrication of 0.2 µm Gate Pseudomorphic Inverted Hemt By Phase-Shifting Technology, *Solid-State Electronics* 38(9):1631-1634, 1995.

Ackmann, P. et al., "Phase Shifting And Optical Proximity Corrections To Improve CD Control On Logic Devices In Manufacturing For Sub sub-0.35-µm I-line," *Proceedings of SPIE 22nd International Symposium on Microlithography* vol. 3051:146-153, Santa Clara, California, Mar. 12-14, 1997.

Asai, N. et al., "Proposal For The Coma Aberration Dependent Overlay Error Compensation Technology," *Jpn. J. Appl. Phys.* 37:6718-6722, 1998.

Balasinski, A. and D. Coburn, "Comparison of Mask Writing Tools and Mask Simulations for 0.16 µm Devices," *IEEE Advanced Semiconductor Manufacturing Conference*, pp. 372-377, 1999.

Barouch, E. et al., "OPTIMASK: An OPC Algorithm For Chrome And Phase-Shift Mask Design," *Proceedings of SPIE* vol. 2440:192-206, Santa Clara, California, Feb. 19-24, 1995.

Chen, J.F., et al., "Full-Chip Optical Proximity Correction With Depth of Focus Enhancement," *Microlithography World*, Summer 1997.

Chen, J.F., et al., "Optical Proximity Correction for Intermediate-Pitch Features Using Sub-Resolution Scattering Bars," EIPBN 3Beam Paper, Jul. 1, 1997.

Chen, J.F., et al., "Practical Method For Full-Chip Optical Proximity Correction," *Proceedings of SPIE 22nd International Symposium on Microlithography* vol. 3051:790-803, Sunnyvale, California, Mar. 12-14, 1997.

Choi, Y.K., et al., "Optical Proximity Correction on Attenuated Phase Shifting Photo Mask for Dense Contact Array," *Proceedings of SPIE*, vol. 2440, *Optical/Laser Microlithography VII*, Santa Clara, California, Feb. 22-24, 1995.

Cobb, et al., "Fast Sparse Aerial Image Calculation For OPC", 15th Annual BACUS Symposium on Photomask Technology and Management, eds. G.V. Shelden and J.N. Wiley, *Proc. SPIE* vol. 2621:534-545, Santa Clara, California, Sep. 20-22, 1995.

Cobb, N. and A. Zakhor, "Experimental Results on Optical Proximity Correction With Variable Threshold Resist Model," *Proceedings of SPIE*, vol. 3051, pp. 458-468, 1997.

Cobb, N. and A. Zakhor, "Fast, Low-Complexity Mask Design," *Proceedings of SPIE*, vol. 2440, pp. 313-327, 1995.

Cobb, N., "Fast Optical and Process Proximity Correction Algorithms for Integrated Circuit Manufacturing," *Proceedings of SPIE*, vol. 3051, *Optical Microlithography X*, Santa Clara, California, Mar. 12-14, 1997.

Dolainsky, C., and W. Maurer, "Application of a Simple Resist Model to Fast Optical Proximity Correction," *Proceedings of SPIE*, vol. 3051, pp. 774-780, 1997.

Fu, C.-C. and T. Yang, "Enhancement of Lithographic Patterns by Using Serif Features," *IEEE Transactions on Electron Devices*, vol. 38, No. 12, pp. 2599-2603, Dec. 1991.

Garofalo, J. et al., "Automated Layout Of Mask Assist-Features For Realizing $0.5k_1$ ASIC Lithography," *Proceedings of SPIE*, vol. 2440:302-312, Santa Clara, California, Feb. 19-24, 1995.

Garofalo, J. et al., "Automatic Proximity Correction For 0.35μm I-Line Photolithography," *IEEE*, 1994, pp. 92-94.

Garofalo, J. et al., "Mask Assisted Off-Axis Illumination Technique For Random Logic," *J. Vac. Sci. Technol. B 11*(6):2651-2658, Nov./Dec. 1993.

Gotoh, Y. et al., "Pattern Dependent Alignment Technique For Mix-And-Match Electron-Beam Lithography With Optical Lithography," *J. Vac. Sci. Technol. B 16*(6):3202-3205, Nov./Dec. 1998.

Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.

Harafuji, K. et al., "A Novel Hierarchical Approach For Proximity Effect Correction In Electron Beam Lithography," *IEEE 12*(10):1508-1514, Oct. 1993.

Henderson, R.C., et al., "Optical Proximity Effect Correction: An Emerging Technology," *Microlithography World*, pp. 6-12, Summer 1994.

Kang, D., et al., "Effects of Mask Bias on the Mask Error Enhancement Factor (MEEF) of Contact Holes," Ref. No. DV010024, *Proceedings of SPIE*, vol. 4346, pp. 858-868, 2001.

Karklin, L., "A Comprehensive Simulation Study Of The Photomask Defects Printability," *SPIE* vol. 2621:490-504, 1995.

Lin, B.J., "Methods To Print Optical Images At Low-$k_1$ Factors," *SPIE Optical/Laser Microlithography III* 1264:2-13, 1990.

Lucas, K., et al., "Model Based OPC for 1st Generation 193nm Lithography," *Proceedings of SPIE*, vol. 4346, 2001.

Matsuura, S., et al., "Reduction of Mask Error Enhancement Factor (MEEF) by the Optimum Exposure Dose Self-Adjusted Mask," *Proceedings of SPIE*, vol. 4346, *Optical Microlithography XIV*, pp. 831-841, 2001.

Morimoto, H. et al., "Next Generation Mask Strategy—Technologies Are Ready For Mass Production Of 256MDRAM?" *SPIE 3236*:188-189, 1997.

Park, C. et al., "An Automatic Gate CD Control For A Full Chip Scale SRAM Device," *SPIE* vol. 3236:350-357, 1997.

Pierrat, C. et al., "A Rule-Based Approach To E-Beam And Process-Induced Proximity Effect Correction For Phase-Shifting Mask Fabrication," *SPIE 2194*:298-309, 1994.

Rieger, M. et al., "Customizing Proximity Correction for Process-Specific Objectives," *SPIE 2726*:651-659, 1996.

Rieger, M. et al., "System For Lithography Proximity Compensation," Precim Company, Portland, Oregon, Sep. 1993 (28 pages).

Saleh, B. et al., "Reduction Of Errors Of Microphotographic Reproductions By Optimal Corrections Of Original Masks," *Optical Engineering 20*(5):781-784, Sep./Oct. 1981.

Spence, C. et al., "Automated Determination Of CAD Layout Failures Through Focus: Experiment And Simulation," *SPIE 2197*:302-313, 1994.

Spence, C. et al., "Integration Of Optical Proximity Correction Strategies In Strong Phase Shifters Design For Poly-Gate Layers," *Bacus News 15*(12):1, 4-13, Dec. 1999.

Stirniman, J. et al., "Fast Proximity Correction With Zone Sampling," *SPIE 2197*: 294-301, 1994.

Stirniman, J. et al., "Optimizing Proximity Correction For Wafer Fabrication Processes," *SPIE, Photomask Technology and Management 2322*:239-246, 1994.

Stirniman, J., et al., "Quantifying Proximity and Related Effects in Advanced Wafer Processes," *Proceedings of SPIE*, vol. 2440, *Optical/Laser Microlithography VIII*, Feb. 19-24, 1995, pp. 252-260.

Stirniman, J. et al., "Wafer Proximity Correction And Its Impact On Mask-Making," *Bacus News 10*(1):1, 3-7, 10-12, Jan. 1994.

Sugawara, M., et al., "Practical Evaluation of Optical Proximity Effect Correction by EDM Methodology," *Proceedings of SPIE 2440*:207-219, Santa Clara, California, Feb. 19-24, 1995.

Wong, A.K., et al., "Lithographic Effects of Mask Critical Dimension Error," *Proceedings of SPIE*, vol. 3334, pp. 106-115, 1998.

Yen, A. et al., "Characterization And Correction Of Optical Proximity Effects In Deep-Ultraviolet Lithography Using Behavior Modeling," *J. Vac. Sci. Technol. B 14*(6):4175-4178, Nov./Dec. 1996.

\* cited by examiner

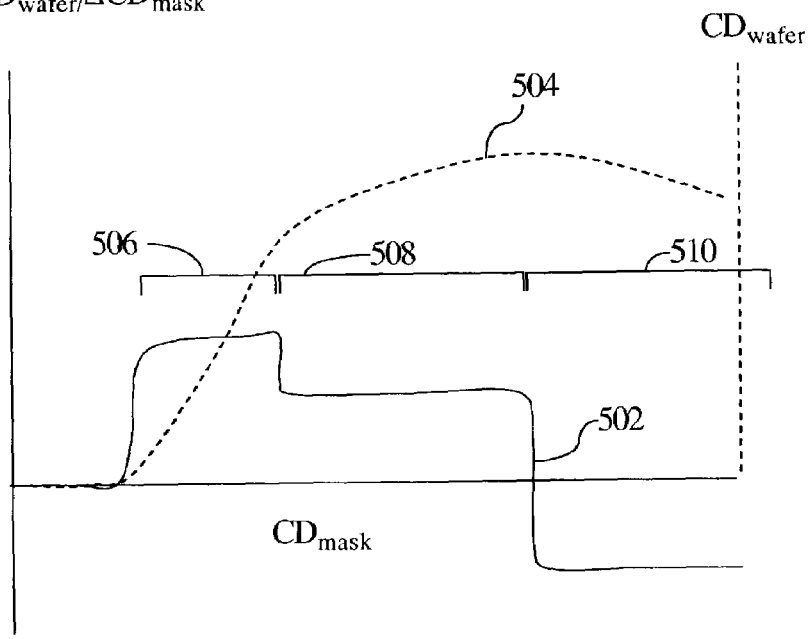
FIG. 5A
FIG. 5B
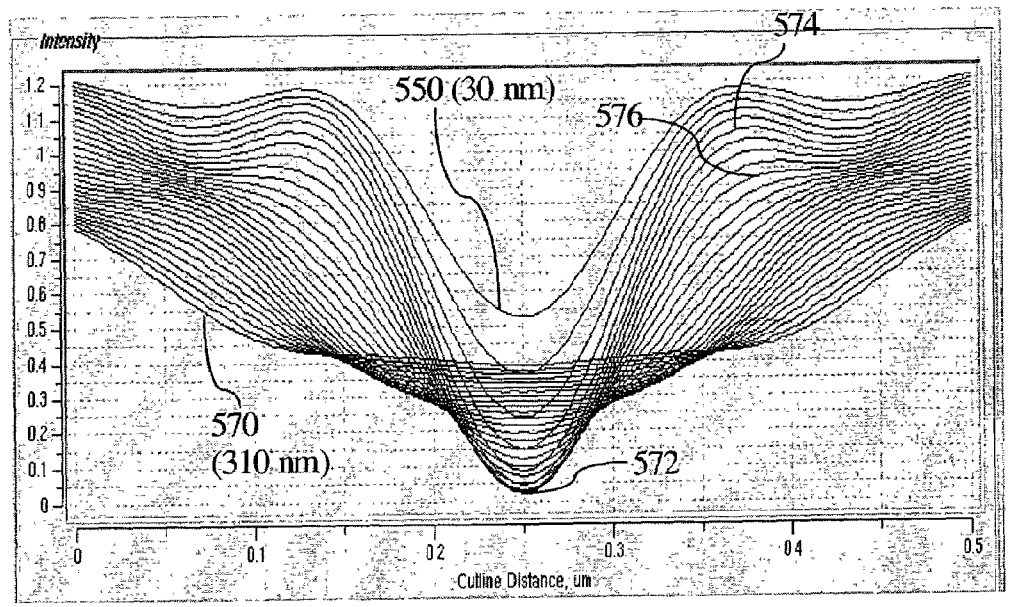

CHROMELESS PHASE MASK LAYOUT GENERATION

TECHNICAL FIELD

The disclosure pertains to methods and apparatus for manipulating layout data for use in chromeless phase mask lithography.

BACKGROUND

The production of complex integrated circuits has required the development of sophisticated methods for transferring circuit patterns to semiconductor substrates. In a typical fabrication process, an optical lithographic technique is used to transfer patterns defined on one or more masks to a photoresist-coated wafer surface. The demand to produce ever more complex circuits requires transfer of smaller and smaller circuit features. Thus, methods of increasing the resolution of lithographic systems are needed.

The basic resolution of an optical lithography system is generally related to a ratio $\lambda/NA$ of an optical wavelength of the radiation used for exposure to the numerical aperture of the optical system used to direct radiation from an irradiated mask to the wafer. Thus, increases in basic resolution require decreases in irradiation wavelength or increases in optical system numerical aperture. While shorter illumination wavelengths can be used, wavelengths below about 100 nm cannot use many convenient optical materials. At some short wavelengths, suitable refractive optical materials are unavailable, and reflective optical systems are required. In some cases, these reflective optical systems must use grazing incidence reflection so that optical system design options are limited. Increases in optical system numerical aperture are generally difficult to achieve, and increased numerical aperture can reduce the tolerance of lithographic processes to defocus. As a result, increasing numerical aperture is unlikely to provide appreciable increases in basic resolution.

While increasing the basic resolution of optical lithographic systems may be impractical, the effective resolution of lithographic systems can be increased by applying one or more so-called resolution enhancement techniques (RETs). Such increases in effective resolution can be associated with a parameter $k_1=CD/[\lambda/NA])$, wherein CD is a critical dimension associated with a particular set of design rules. For some circuit devices fabricated with 180 nm or smaller design rules, values of $k_1$ less than 0.5 have been demonstrated. At $k_1<0.25$, photolithographic exposures using a pattern of equally spaced lines of dimension equal to the critical dimension produce only an average illumination intensity at the photoresist without any appreciable intensity variation associated with pattern features. Thus, $k_1=0.25$ can be regarded as a resolution limit for optical systems using RET.

While RETs can be used to increase effective resolution, RETs can also be used to increase process "window," i.e. to increase process tolerance to inevitable variations in process parameters associated with masks, substrates, lithographic apparatus, and manufacturing processes. For production lithographic systems, an effective resolution of about $k_1=0.28$ generally provides acceptable process window.

Unfortunately, the actual resolution limit achievable using most RETs depends on the pattern to be transferred as well as the placement of pattern features with respect to each other. Thus, application of a selected RET depends on the particular pattern and its placement as well as the availability of additional processing methods associated with resist development, over-exposure, multiple exposure, etch biasing, and other methods. Accordingly, improved lithographic methods, device manufacturing methods, and associated design tools are needed.

SUMMARY

Layout processing methods comprise obtaining layout data for at least one feature from a layout database and assigning a lithographic size identifier to the at least one feature. A twin phase-edge descriptor is assigned to the at least one feature and exported to the layout database. In other examples, an initial layout representation is read and processed to form a hierarchical database. In some examples, the lithographic size identifier is associated with a minimum design feature size range or an intermediate design feature size range. In other examples, at least one sub-resolution assist feature descriptor is associated with the at least one feature, and the sub-resolution assist feature descriptor is exported to the database. In additional representative examples, the twin phase-edge descriptor and the at least one sub-resolution mask feature descriptor are based on a photolithographic process model. In further examples, the lithographic size identifier is associated with a large design feature size range and a descriptor for a plurality of phase edges is associated with the at least one feature and exported to the layout database.

Layout processing methods comprise obtaining data for at least one feature from a layout database and assigning a lithographic size identifier to the at least one feature. Twin phase-edge pattern data is associated with the at least one feature based on the assigned lithographic size identifier and the twin phase-edge pattern data is exported to the layout database. In some examples, the methods further comprise reading an initial layout representation and creating the layout database based on the initial layout representation, wherein the layout database is a hierarchical database. In other examples, data for at least one sub-resolution assist feature is associated with the at least one feature, wherein the sub-resolution assist feature data is selected based on the lithographic size identifier, and the sub-resolution assist feature data is exported to the layout database. In representative examples, the lithographic size identifier is associated with a minimum design feature size range, an intermediate design feature size range, or a large design feature size range. In further examples, at least one characterization parameter of a photolithographic process model is retrieved and phase-edge pattern data and sub-resolution assist feature data are configured based on the at least one characterization parameter. In additional examples, mask pattern data for a plurality of phase edges is configured based on the at least one characterization parameter.

According to representative examples, layout processing methods comprise assigning lithographic size identifiers to a plurality of features defined in a layout database, wherein the lithographic size identifiers are associated with a minimum size range, an intermediate size range, and a large size range. Mask pattern features are assigned to the plurality of features based on the assigned lithographic size identifiers.

Methods of processing a circuit layout comprise obtaining layout data from a layout database, processing the layout data to identify layout features based on a minimum size range, an intermediate size range, and a large size range, and assigning twin phase-edge mask pattern data to at least the layout features associated with the minimum size features. The assigned twin phase-edge mask pattern data is exported to the layout database. In representative examples, subresolution assist feature data is assigned to features associated with an intermediate feature size range and exported to the layout database. In other examples, a plurality of phase edges are assigned to features associated with the large feature size range and corresponding phase-edge data is exported to the layout database.

Layout processing methods comprise reading an initial layout representation and creating a hierarchical layout database based on the initial layout representation. Data for at least one feature is obtained from the hierarchical layout database. Twin phase-edge pattern data is associated with the at least one feature and exported to the hierarchical layout database Methods of determining chromeless phase mask layout data comprise establishing a hierarchical representation of a device layout and associating twin phase-edge data with at least some features defined in the hierarchical representation. In representative examples, the twin phase-edge data is exported to the hierarchical database. In additional examples, sub-resolution assist feature data is associated with at least some features based on one or more feature size ranges.

Methods of generating mask pattern data comprise selecting at least one pattern portion from a layout database and selecting a phase-edge density. A plurality of phase edges are associated with the pattern portion based on the selected phase-edge density and phase data associated with the plurality of phase edges is exported to the layout database. In representative examples, the phase-edge density includes directional phase-edge densities associated with two coordinate axes, and one or more of the directional phase-edge densities are variable. In other examples, the phase-edge density is selected based on a size of the selected pattern portion, on a predetermined process window for the selected pattern portion, or a predetermined process window for a feature other than the selected pattern portion.

Methods of selecting a size range for chromeless phase lithography, comprise computing an mask error function (MEF) and associating a minimum size range with a portion of the MEF in which computed feature size varies approximately proportionally with mask feature size. In other examples, an intermediate size range is associated with a portion of the MEF in which computed feature size does not vary substantially as a function of mask feature size. In additional examples, a maximum feature size range is selected based on mask feature sizes for which the MEF has a maximum negative value.

Methods of selecting size ranges for chromeless phase lithography comprise simulating aerial intensities for a plurality of isolated features having respective feature widths and establishing a minimum feature size range based on a feature size associated with a minimum aerial intensity. In additional examples, an intermediate size range is established based on a feature size associated with a reduced diffraction sidelobe.

Lithographic methods comprise defining a plurality of pattern features on a chromeless phase lithographic mask, and providing sub-resolution assist features for at least one pattern feature associated with an intermediate size range. A substrate is exposed with an off-axis illumination beam using the chromeless phase mask to define pattern features on the substrate. In representative examples, a plurality of phase edges is provided for at least one pattern feature in a large size range. According to other examples, at least one feature in a minimum size range is defined using twin phase edges. In other examples, wafers or other substrates are provided that include pattern features produced using such methods.

Masks are provided that include one or more pattern features defined by a plurality of phase edges, wherein the plurality of phase edges has a variable pitch. In representative examples, the pitch varies along two coordinate axes, and the phase edges are configured as a phase grating or an array of phase dots.

Methods for providing and selecting from a menu on a display in a computer system having a graphical user interface, a display, and a user interface selection device, comprise the steps of displaying menu entries associated with one or more lithographic size descriptors and configuring the user interface selection device to provide a signal indicative of a user selection of at least one of the lithographic size descriptors.

Computer-readable media are provided having computer-executable instructions for retrieving layout data from a hierarchical database, assigning twin phase-edge data to at least one feature defined in the retrieved layout data, and exporting twin phase-edge data to the hierarchical database.

These and other features and examples are described below with reference to the accompanying drawings.

BRIEF DESCRIPTION OF THE DRAWINGS

FIG. 5A shows mask error function (MEF) and critical dimension on a wafer as a function of critical dimension on a mask obtained by simulations based on chromeless-phase lithography (CPL) using an exposure wavelength of 193 nm and an optical system numerical aperture of 0.75.

FIG. 5B is a graph of aerial image intensity as a function of position for single phase features having widths ranging from 30 nm to 310 nm obtained by simulations based on chromeless-phase lithography (CPL) using an exposure wavelength of 193 nm and an optical system numerical aperture of 0.75.

DETAILED DESCRIPTION

Figure 1A:
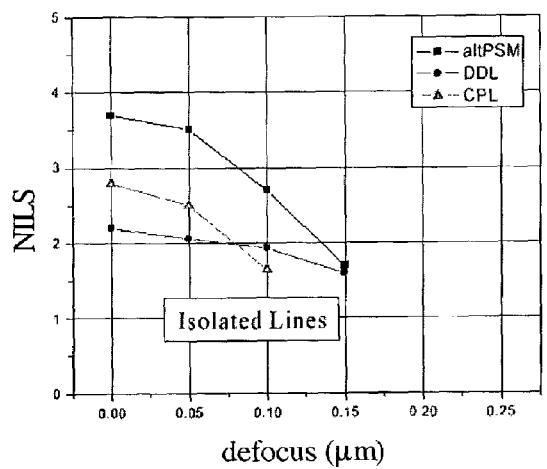
FIGS. 1A–1B are graphs of simulated normalized image log slopes (NILS) as a function of defocus for lithographic exposures using alternating phase-shift masks (alt-PSM), double-exposure dipole lithography (DDL), and chromeless phase lithography(CPL) for pattern regions having isolated lines and nested lines.

Integrated circuit patterns are typically transferred from a pattern mask or reticle to a substrate that is coated with a photoresist. The substrate is generally a wafer of silicon or other semiconductor material, but patterns can similarly transferred to other substrate materials. Patterns on a mask can be projected or imaged onto a substrate, or the mask can be placed on the substrate so that patterns are transfer by contact printing.

Because of integrated circuit complexity, computer-based integrated circuit design and verification tools can be used to, for example, determine the masks and mask patterns necessary to realize a selected integrated circuit design. Such tools can facilitate the determination of, for example, conductor routing, device placement, as well a permit reliable simulation of actual circuit performance. Use of computer-based tools generally permits evaluation of several design architectures based on circuit area, speed, power, or other factors. After selection of a particular architecture, a computer-based tool can be used to determine a physical layout of the circuit and configure mask features needed for photolithographic processes.

Such computer-based tools can be configured to define mask patterns based on one or more resolution enhancement techniques (RETs). The use of RETs is typically complicated by the dependence of RET performance on feature shape, size, and feature placement with respect to other features. A computer-based design tool can be configured to access layout data stored in a database and apply or select one or more RETs based on a consideration of one or more selected features or a consideration of all or substantially all features.

For example, such a tool can be configured to select a preferred RET for a particular pattern feature, or to provide an indication of a simulated performance of a selected RET with respect to other available (or unavailable) RETs. Because a computer-based tool can access a stored layout or generate a layout based on a circuit design, a number of lithographic processes can be evaluated, and mask designs based on a selected process can be verified prior to mask fabrication. Mask pattern data can be exported and stored with layout data.

RETs can also be combined with optical proximity correction or optical and process correction (OPC) that is generally configured to compensate or correct losses in pattern-transfer fidelity in image formation, chemical and physical interactions of photoresists and developers, loading variations in etching, and interactions of pattern features in one or more steps in pattern transfer. OPC can be configured to "predistort" or "pre-compensate" pattern data so to improve fidelity of the pattern as transferred. OPC techniques can generally be identified as so-called "rule-based" OPC or "model based" OPC. In rule-based OPC, a predetermined alteration is made to a particular layout when certain conditions are encountered. For example, hammerhead features can be inserted on line ends. In model-based OPC, a process model is used to simulate layout appearance on a wafer, and layout alterations are configured so that the simulated layout appearance approximates a desired layout appearance, typically within a predetermined tolerance range.

One RET is based on alternating phase-shift masks (alt-PSMs) that typically define a pattern feature using a series of 0-degree/180-degree phase steps. Alt-PSMs can be used to achieve effective resolutions of $k_1 \leq 0.3$, and manufacture of such masks can be straightforward. Double exposures are typically needed to print arbitrary combinations of lines and spaces, and manufacturing processes using alt-PSMs can be complex. In some applications, some portions of an alt-PSM mask are covered with an opaque chromium layer in addition to the phase-shifting layers. Unfortunately, some pattern features such as "T"-intersections of minimum width lines typically print with significant widening. Alt-PSM based pattern-transfer is also complication by difficulties associated with assigning phases correctly to obtain an intended pattern of phase steps (the co-called "coloring issue") without using decomposition methods that degrade process window.

Other RETs such as double-exposure dipole lithography (DDL) use off-axis mask illumination. Pattern-transfer with such RETs typically exhibits resolution dependences on off-axis illumination directions. For example, in DDL, pattern transfer of dense lines and spaces oriented with respect to a selected axis exhibits the same effective resolution as alt-PSM. However, pattern transfer of similar structures oriented orthogonally to the selected axis exhibits reduced resolution. Therefore, a particular layout can be decomposed into two masks that contain mutually orthogonal pattern features. Thus, pattern transfer of patterns features oriented with respect to orthogonal axes exhibits resolution similar to that obtained using alt-PSMs, while non-orthogonal feature edges print with less contrast. However, not only the orientation of a feature edge, but edge context in a whole pattern layout can determine printed pattern contrast. Thus, for any particular feature, the effects of nearby features on the DDL pattern-transfer process can be estimated by simulation of other methods.

DDL and other off-axis illumination RETs are generally optimized for a particular pitch, typically a rather dense pitch. In order to extend the advantages of DDL to isolated lines, sub-resolution assist features (SRAFs) can be used in conjunction with DDL. When using SRAFs, DDL exhibits the same "forbidden pitches" limitation generally associated with SRAFs. Such forbidden pitches are associated with mask patterns that include a line separated from an adjacent line by a distance large enough to significantly decrease the contrast advantage of the RET (especially at defocus), but still small enough that addition of an SRAF is ineffective. Depending on the particulars of the lithography setup, such as, for example, the size of dipole illumination structures and photoresist contrast, the process window loss for forbidden pitches can be limited to an acceptable amount, but typically by giving up some process window for denser structures. SRAFs can be placed using rules, model-based algorithms, or a combination thereof. Generally placement of SRAFs in actual layouts is based on simulation, and a combination of simulations and printing experiments can be used to balance the process window for critical structures with a preferred process window for other layout features.

Chromeless phase lithography (CPL) generally uses chromeless mask features to define circuit features using pairs of 0-degree/180-degree phase steps. These phase steps can be obtained by, for example, etching a trench in a quartz substrate to a depth corresponding to a 180-degree phase shift at the illumination wavelength of the lithography system. Alternatively, phase shift layers can be formed as mesas on a quartz or other substrate. Wafer exposures obtained with such CPL masks tend to exhibit low contrast if exposed using on-axis illumination, but exposure with off-axis illumination can provide enhanced resolution and/or process window.

Figure 1B:
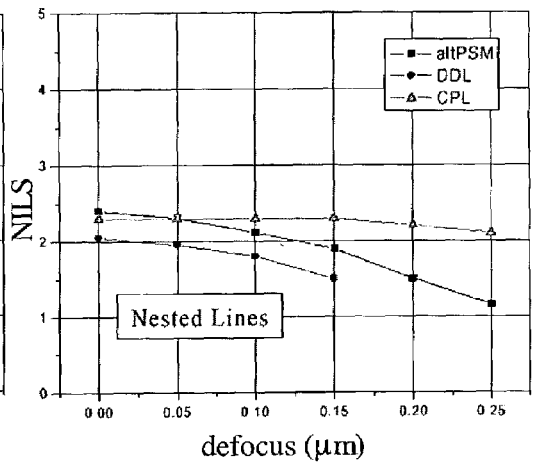

FIGS. 1A–1B are graphs of normalized image log slopes (NILS) as a function of defocus that illustrate the performance of alt-PSM, DDL, and CPL for an isolated 65 nm wide line (FIG. 1A) and nested 65 nm lines at a 160 nm pitch (FIG. 1B). Normalized image log slope is defined as $NILS = \partial lnI / \partial lnx|_{edge}$, wherein I=relative aerial image intensity and x=wafer coordinate. NILS values of 1.5 to 2 generally correspond to exposure latitudes of about 10% for high contrast resists. As shown in FIGS. 1A–1B, both DDL and CPL exhibit performance comparable to alt-PSM. The graphs of FIGS. 1A–1B are based on simulations of aerial image intensities, i.e., on simulated radiation intensities at a wafer surface as a function of location on the wafer surface.

Figure 2A:
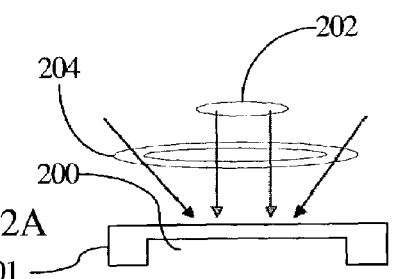
FIG. 2A is a sectional view of a pattern region that includes an isolated 180 degree phase feature of width 310 nm defined on a chromeless phase mask.
Figure 2B:
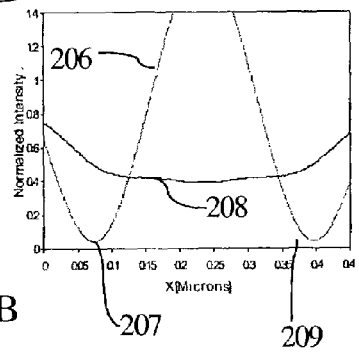
FIG. 2B is a graph of simulated exposures produced using on-axis and off-axis illumination of the 310 nm wide isolated 180-degree phase feature of FIG. 2A. On-axis illumination is simulated with an exposure wavelength of 248 nm, an optical system numerical aperture of 0.6, and a partial coherence of σ=0.6. Off-axis illumination is simulated with annular illumination with an exposure wavelength of 248 nm, an optical system numerical aperture of 0.75, and partial coherences of $\sigma_{in}$=0.7 and $\sigma_{out}$=0.9.
Figure 2C:
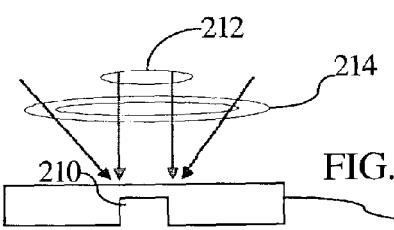
FIG. 2C is a sectional view of a pattern region that includes an isolated 180 degree phase feature of width 60 nm defined on a chromeless phase mask.
Figure 2D:
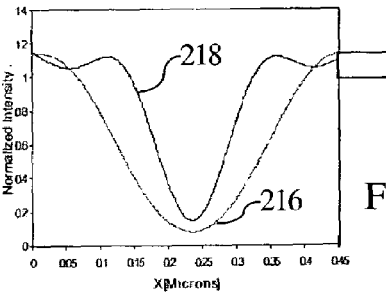
FIG. 2D is a graph of simulated exposures produced using on-axis and off-axis illumination of the 60 nm wide isolated 180-degree phase feature of FIG. 2C. On-axis and off-axis illumination conditions are the same as those of FIG. 2B.

FIGS. 2A–2D illustrate simulated aerial image intensities obtained by simulated exposure of a wide (310 nm) phase region and a narrow (70 nm) phase region using CPL. Referring to FIGS. 2A–2B, a wide phase region defined as a groove 200 in a quartz or other mask substrate 201 is illuminated with an on-axis illumination beam 202, and produces an aerial image intensity 206 at a substrate plane. The groove 200 is configured to produce a 180 degree phase shift with respect to ungrooved portions of the quartz substrate 201. Exposure of the wide phase region with an off-axis illumination beam 204 produces an aerial image intensity 208. The contrast produced using on-axis illumination is greater than the contrast produced using off-axis illumination, but intensity minima 207, 209 associated with edges of the phase region are separated, and aerial image intensity directly below a central portion of the groove 200 is relatively high. Referring to FIGS. 2C–2D, a narrow phase region defined as a groove 210 in a quartz substrate 211 is illuminated with an on-axis illumination beam 212 and produces a simulated aerial image intensity 216 at a substrate plane. The groove 210 is configured to produce a 180 degree phase shift with respect to ungrooved portions of the quartz substrate 211 Exposure of the narrow phase region with an off-axis illumination beam 214 produces a simulated aerial image intensity 218. In this case, the contrast obtained with off-axis illumination is greater than the contrast obtained with on-axis illumination. Thus, for a wide phase region, on-axis illumination produces two high contrast image portions associated with two 0-degree/180-degree phase steps, while off-axis illumination produces a lower contrast aerial image intensity. For narrow phase regions, off-axis illumination produces a higher contrast aerial image intensity with relatively low exposure intensity (a dark line) associated with a center of the narrow phase region. Thus, CPL can be used to print a narrow phase region as a single dark line while a wide phase region tends to print as two separated lines.

Figures 3A, 3B, 3C:
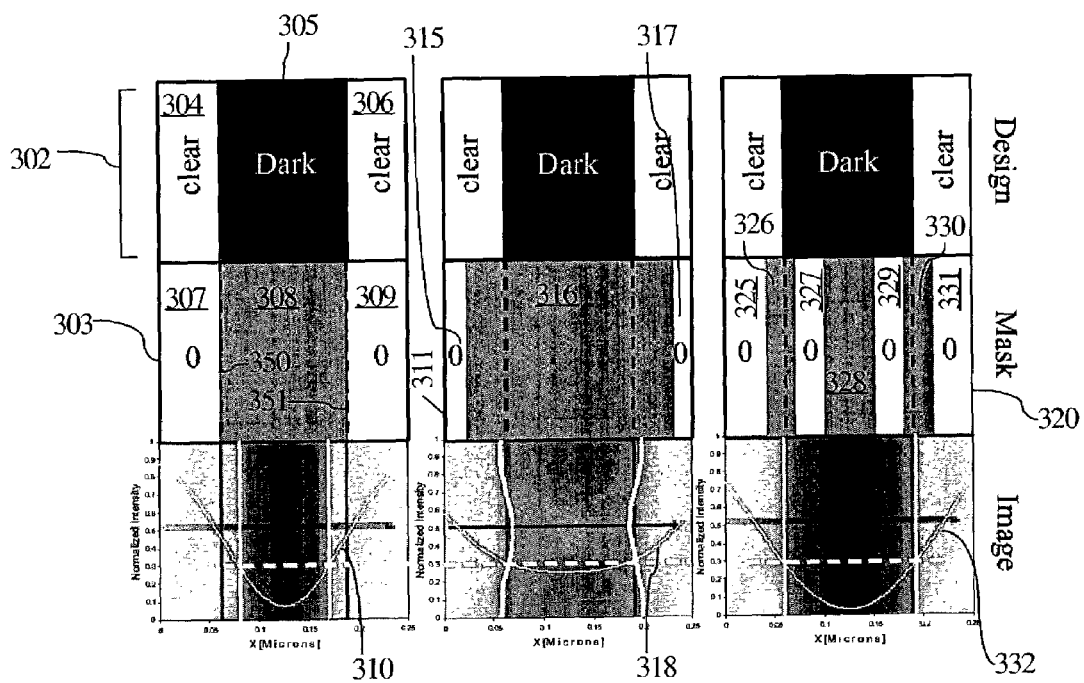
FIG. 3A illustrates an exposure produced using an uncorrected chromeless phase mask having a central region of width approximately equal to a design width.
FIG. 3B illustrates an exposure produced using a biased chromeless phase mask having a central region of width that is biased to be wider that a design width.
FIG. 3C illustrates an exposure produced using a chromeless phase mask having sub-resolution assist features (SRAFs).

Although CPL exhibits some limitations in pattern-transfer of phase regions such as the phase region 200, such pattern transfer can be substantially improved using OPC. A representative procedure is illustrated with reference to FIGS. 3A–3C. FIG. 3A illustrates a selected design exposure 302 that includes regions 304, 306 in which photoresist is to be exposed, and a central region 305 having a 130 nm width for which no exposure is intended. A corresponding mask portion 303 selected to produce these exposures includes 0-degree phase shift areas 307, 309 and a 180-degree phase-shift area 308. For convenience, dashed lines 350, 351 show the intended exposure width. Curve 310 illustrates a simulated aerial image intensity obtained using the mask portion 303 and illustrates that an effective exposure width, defined as a full width at 0.3 normalized intensity, is less than the intended 130 nm width. FIG. 3B illustrates a mask portion 311 having 0-degree phase-shift edge regions 315, 317 and a 230 nm-wide 180 degree phase-shift central region 316. The mask portion 311 can be referred to as "biased" as the width of the central region 316 is increased with respect to the intended exposure width to compensate for the reduction in central feature width shown in FIG. 3A. As is apparent from a curve 318 of a simulated aerial image intensity produced with the mask portion 311, the effective exposure width is approximately equal to the 130 nm design width, but exposure contrast is reduced and process window is reduced. FIG. 3C illustrates simulated exposure using a mask portion 320 that includes 0-degree portions 325, 327, 329, 330 and 180-degree portions 326, 328, 330. The portions 326, 327, 329, 330 have approximate widths of 40 nm, and can be referred to as sub-resolution assist features. An associated curve 322 of simulated aerial image intensity shows that the effective exposure width is approximately equal to the intended 130 nm width. The exposure contrast is increased with respect to that produced with the biased mask portion 311 but is somewhat less than that associated with the mask portion 303. Nevertheless, based on these simulations, exposure with the mask portion 320 provides acceptable process window while producing an exposure that achieves the intended 130 nm feature width.

As shown in FIGS. 3A–3B, increasing phase region width produces an increased exposure associated with an interior portion of phase regions such as the phase regions 308, 316. Adjusting exposure width by increasing of phase-region width tends to reduce exposure contrast and degrade process window. Addition of SRAFs such as the regions 326, 327, 329, 330 enhances contrast while producing a targeted effective exposure width. SRAF placement can be selected using rules and/or model-based algorithms, but either rules or model-based algorithms or other methods can be used alone or in combination with other methods. Typically a combination of simulations and exposure experiments permits design of associated SRAFs.

Figures 4A, 4B:
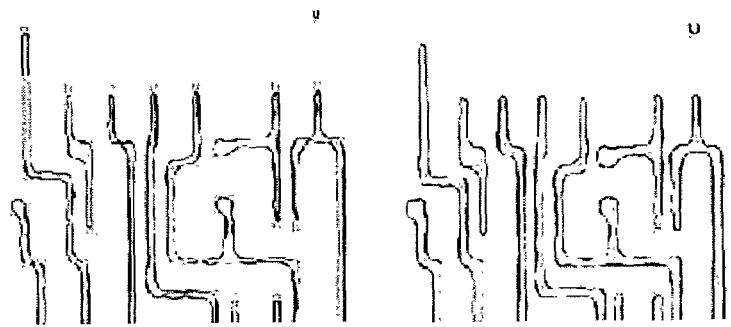
FIGS. 4A–4B are schematic plan views illustrating DDL aerial image intensities produced with and without optical process correction (OPC), respectively.
Figures 4C, 4D:
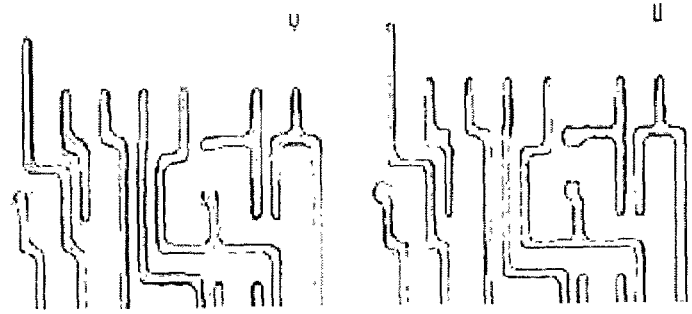
FIGS. 4C–4D are schematic plan views illustrating CPL aerial image intensities produced with and without optical process correction (OPC), respectively.
Figure 4E:
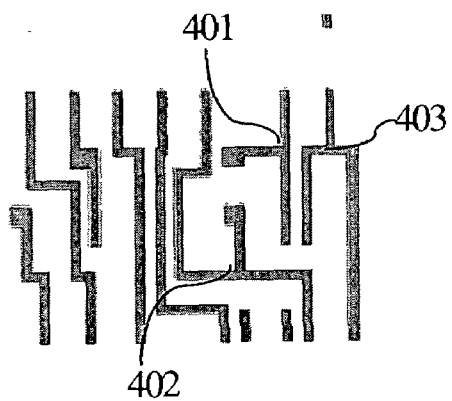
FIG. 4E is a schematic plan view corresponding to an intended design exposure to be achieved by the exposures of FIGS. 4A–4D.

FIGS. 4A–4D illustrate exposure improvements using SRAFs in DDL and CPL. FIG. 4E is a plan view of a representative layout 400 based on a 65 nm minimum linewidth and a 160 nm minimum pitch. FIGS. 4A–4B are plan views of simulated DDL exposures (aerial images) with and without, respectively, OPC. FIGS. 4C–4D are plan views of simulated CPL exposures with and without, respectively, OPC. Simulations were based on an exposure wavelength of 193 nm and optical system numerical aperture of 0.75. For convenience, the simulations of FIGS. 4A–4D show only aerial images to clarify how exposure intensities can be controlled. Resist properties, including improvements in 193 nm resists, can enhance performance and can be included in other simulations. The aerial images of FIGS. 4A–4D were obtained using CALIBRE WORKBENCH software, available from Mentor Graphics Corporation, Wilsonville, Oreg.

Both DDL and CPL layouts were corrected for printing nonlinearities by model-based OPC performed using CALIBRE OPCpro model-based OPC software from Mentor Graphics, Corporation, Wilsonville, Oreg. For DDL, OPC was configured to change both masks simultaneously. For the DDL simulations, horizontal and vertical features were placed on separate masks, each with separately optimized illumination. Layout decomposition for DDL was done according to the method described in Torres et al., "Model Assisted Double Dipole Decomposition," Optical Microlithography XV, Proc. SPIE 4691 (2002) using a contrast-based algorithm to determine which feature edges were to be printed with each mask. FIGS. 4A–4B show the results with DDL at best focus before and after model-based OPC correction for printing process non-linearity. Layout modifications for CPL exposures used rule-based generation of chromium structures, followed by rule and model-based generation of assist structures to compensate intermediate linewidth structures. FIGS. 4C–4D show CPL results at best focus before and after model-based OPC.

No portions of the layout 400 appear to have difficulties in either DDL or CPL. The T-intersections 401, 402, 403 printed as well as other features. For the layout 400 of FIG. 4E, the minimum-width T-intersections 401, 402, 403 are problematic for alt-PSM pattern transfer as it is difficult to assign correct phases to all lines. In contrast, CPL prints stems and crossbars of the T-intersections 401, 402, 403 using a single mask with only minor OPC correction. Simulations and printing of representative layout samples of different designs can be used to identify any layout sensitivities of a particular DDL or CPL exposure.

A selected RET generally increases process window of certain types or arrangements of features, and in association with particular exposure method. For example, off-axis illumination (OAI) techniques such as DDL provide enhanced process window for dense lines and spaces. SRAFs provide an optically dense neighborhood for isolated lines, and therefore increase the process window for such features when exposed using OAI. With or without RETs, lithography at low $k_1$ is highly non-linear and transferred pattern portions do not necessarily have a linear (e.g. demagnified and/or uniformly biased) resemblance to the pattern portions on the mask. So-called optical proximity correction (OPC) can be used to correct or compensate this non-linearity based on measurement and simulation of process non-linearities. Corrections can be applied by inversion of the process model and/or by iterative changes of geometry data that define the masks in order to generate a printed image as close as possible to an intended image. Additional OPC can be used in DDL, CPL, or other lithographic processes to further improve pattern-transfer fidelity.

Thus, pattern transfer can be configured based on RETs such as alt-PSM, DDL, and CPL, or other techniques in combination with OPC. The following Table summarizes some features of available RETs and combinations, including simple OPC and high-transmission attenuated phase-shift masks (HT-PSM), i.e. phase shift masks that include regions having transmissions as low as about 5% to 15%. It will be appreciated that the Table provides only a rough guide as to RET performance and applicability, and that a computer-based design tool can selected a particular RET based on simulations, models, or rules.

TABLE

Properties of selected RETs.

| RET | $k_1$ (min) | Layout Restrictions | Exposure |
|---|---|---|---|
| OPC | 0.45 | None | Single |
| Annular Ill./HT-PSM | 0.38 | None | Single |
| Annular Ill./SRAF/HT-PSM | 0.32 | Forbidden pitches | Single |
| DDL | 0.28 | Same as SRAF | Multiple |
| CPL | 0.28 | Intermediate linewidths | Single |
| Alternating PSM | 0.28 | Many | Multiple |

As described above, layouts can be generated based on, for example, CPL, using twin phase edges to define minimum features sizes while intermediate feature sizes are associated with SRAFs or attenuated phase shift regions in addition to phase edges. Larger features can be filled with phase edges or replaced by opaque chrome. In general, a layout can be processed to identify features associated with a small size range, an intermediate size range, and large size range so that appropriate RETs or other techniques can be applied to features based on feature size, placement, orientation, or other considerations.

Groupings of pattern features into so-called small, intermediate, and large pattern feature groups can be arranged based directly on feature size. For example, a small feature size range can be based on optical system resolution. Other illustrative methods for establishing a division between so-called small, intermediate, and large pattern features are illustrated with reference to FIGS. 5A–5B. FIG. 5A includes a curve 502 representing mask error factor (MEF) as a function of critical dimension on a mask ($CD_{mask}$). MEF is defined as a ratio of a change in a CD on a wafer to a corresponding change in a CD on a mask, i.e., MEF=$\Delta CD_{wafer}/\Delta CD_{mask}$. FIG. 5A also includes a curve 504 of critical dimension on the wafer ($CD_{wafer}$) as a function of $CD_{mask}$. The curves 502, 504 can be obtained using simulated aerial intensities associated with an array of critical dimension lines of fixed separation based on an, for example, an illumination wavelength 193 nm, and an optical system numerical aperture of 0.75 or other configuration. The MEF curve 502 has a small feature portion 506 associated with feature sizes for which small changes in $CD_{mask}$ produce approximately proportional changes in $CD_{wafer}$. The MEF curve 502 also includes an intermediate feature portion 508 in which changes in $CD_{mask}$ produce relatively smaller changes in $CD_{wafer}$. For feature sizes in this region, $CD_{mask}$ is more nearly independent of wafer feature size. A large feature portion 510 of the MEF curve 502 corresponds to mask feature sizes for which increases in mask feature size produces decreases in wafer feature size. Using the MEF curve 502, features sizes in a particular design can be identified as small, intermediate, or large based on the sign of the MEF and an appropriate technique used to define corresponding portions of a mask. For example, as noted above, pattern transfer of features of intermediate size can be implemented in CPL with SRAFs. Large features can be defined using a series of alternating phase stripes of constant or variable pitch, using opaque chromium, or otherwise defined. A particular phase-edge arrangement can be selected based on a selected process window for one or more pattern features. Alternatively, a phase-edge density can be selected based on a feature size, so that a fixed or variable number of phase edges are used to define the feature.

Classification of features sizes can be based on simulated aerial image intensities as shown in FIG. 5B. FIG. 5B contains a series of curves of simulated aerial image intensity for isolated 180-degree phase lines of widths ranging from 30 nm to 310 nm in 10 nm increments. Curves 550, 570 correspond to feature widths of 30 nm and 310 m, respectively. Small features can be identified approximately as features for which a minimum aerial image intensity decreases with increases in feature sizes. Curve 572 (80 nm feature size) corresponds to a small feature size boundary. An intermediate feature size boundary can be approximately identified with a feature size at which an aerial image intensity for which an intensity sidelobe is substantially eliminated. For example, the curve 572 (80 nm feature size) exhibits a sidelobe 574 that is substantially attenuated for a feature size of 120 nm, corresponding to a curve 576. Simulated exposures were based on a wavelength of 193 nm and an illumination numerical aperture NA=0.75.

Figures 6A, 6B, 6C, 6D:
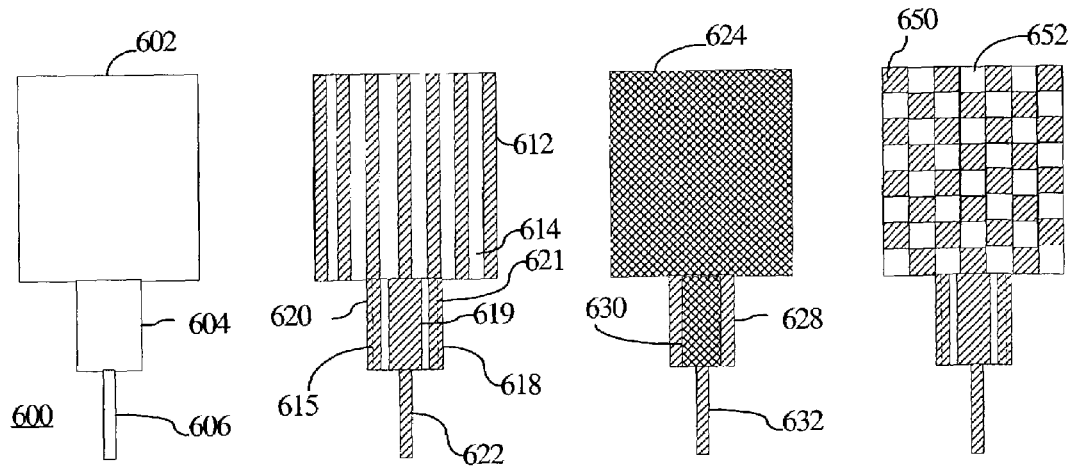
FIG. 6A is a plan view of an intended exposure pattern.
FIGS. 6B–6D are plan views of mask portions selected to approximately produce the exposure pattern illustrated in FIG. 6A.

Layout processing using feature size identification is described with reference to FIGS. 6A–6D. A portion 600 of a physical layout includes representative features 602, 604, 606 that correspond to wafer regions that are to receive relatively low exposures during lithographic pattern transfer. Based on methods such as those described above, features 606, 604, 602 are identified as small, intermediate, and large, respectively. In view of this feature classification, the feature 606 can be realized with a single 180 degree phase region 622 in CPL as shown in FIG. 6B. The phase region 622 has two 0-degree/180-degree phase edges. As shown in FIG. 6B, the intermediate feature 604 can be realized using a 180-degree phase regions 619 and SRAF 180-degree phase regions 618, 620. Typically, SRAF features are provided in defining intermediate size features. For convenience, a dashed line 621 is shown corresponding to the intended width of the feature 604. Alternatively, the feature 604 can be realized with a 180-degree phase region 628 in combination with a chrome region 630 as shown in FIG. 6C. Typically, SRAFs or attenuated phase shift structures can be used with intermediate size features.

The feature 602 can also be defined on a mask in various ways. In FIG. 6B, the feature 602 is realized as an alternating series of 0-degree phase regions and 180-degree phase regions such as representative phase regions 612, 614. The alternating phase regions can have a variety of pitches, a variable pitch, be oriented as shown or at other angles with respect to the feature 602. Phase region width and separation can also be varied. Alternatively, the feature 602 can be defined on a mask using a grid of 0-degree and 180-degree phase shift regions such as representative regions 650, 652 as shown in FIG. 6D. Alternatively, a series of phase edges, phase dots, a phase checkerboard, or a phase grating can be used, with a density and pitch sufficient to produce a selected exposure. Density and/or pitch can be selected based on feature size or otherwise, and can be variable in one or more directions. As shown in FIG. 6C, the feature 602 can also be patterned using a chrome portion 624. Mask pattern features can be additionally refined using optical and process correction (OPC) techniques in which process characterization is used to model and compensate pattern distortions and other pattern transfer defects.

Figure 7A:
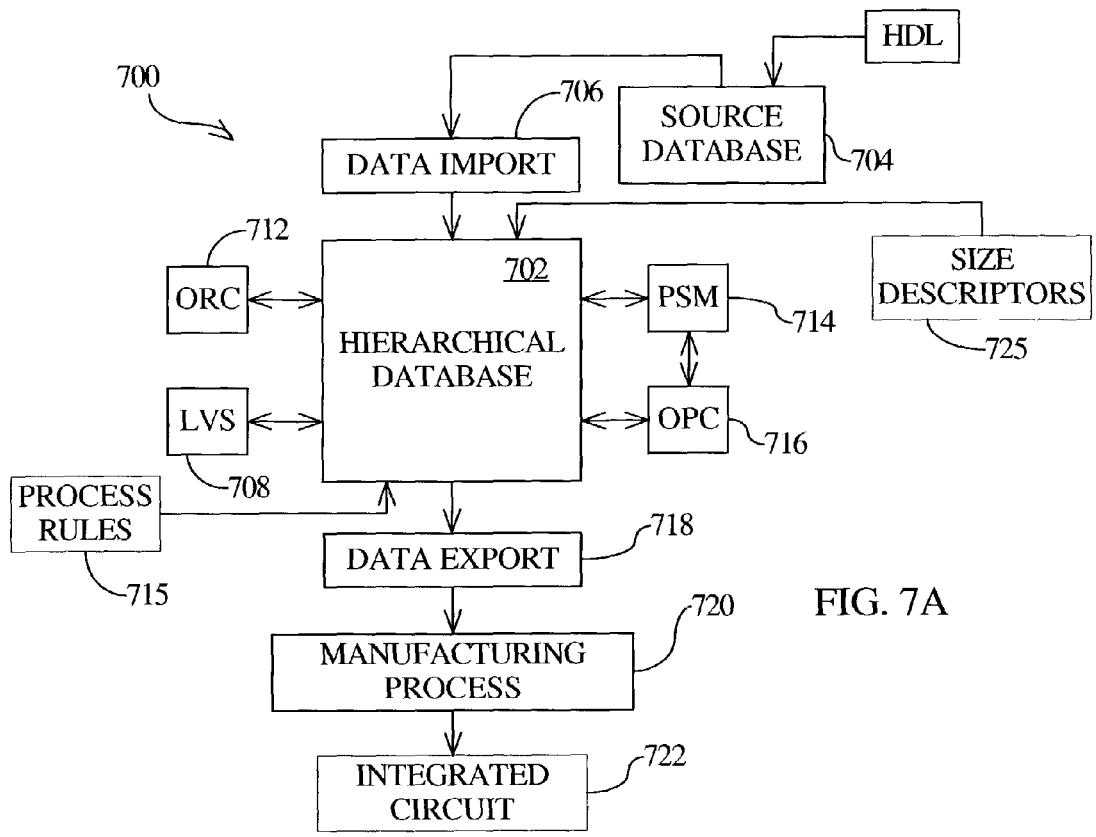
FIG. 7A is a schematic block diagram of software tool for circuit design and analysis configured to access data in a hierarchical database.

Application of lithographic techniques can be implemented using computer-based design and verification tools that produce layout data that includes descriptors associated with pattern feature sizes or application of SRAFs and/or OPC to one or more pattern features. Such computer-based tools permit design and analysis of circuit devices that have large numbers of circuit elements, and can provide conversion of design data into layout data and mask pattern data for verification prior to mask production. Referring to FIG. 7A, an integrated verification and manufacturability tool 700 includes a hierarchical database 702 configured to store layout data obtained by processing layout data in a source database 704 with a data import component 706. The layout data in the source database 704 is typically based on a high level circuit description using, for example, a hardware description language (HDL).

Source data is processed by the data import component 706 to produce a hierarchical representation of a physical layout. This hierarchical representation typically includes data layers associated with actual physical layers for a circuit as well as cells that define sets of particular devices within the circuit. Cells can be nested within cells in a data hierarchy. Source design data is typically provided in formats such as GDS-II, although other formats can also be used. Such descriptions typically include specifications specifications for one or more polygonal areas that are portioned into one or more layers. A typical design can also include cells that contain such polygonal areas and cell placements. The data import component processes the source data to identify design data portions that occur more than once so that these portions need be analyzed only once. Data pertaining to such design portions can be referred to as "context-independent" data. Analysis of some design data portions is based on cell placement with respect to other design features such as cells. Such data is referred to as "context-dependent" data. By identifying context-independent data, execution time for subsequent processing steps can be reduced. Some design portions include both context-independent and context-dependent data. For such design portions, context-independent data can be processed and context-dependent data can be advanced or "promoted" to a subsequent hierarchical layer for additional processing. Such promotion can be selected based on, for example, the type of processing operation and input layers used by a processing operation.

As noted above, the hierarchical database 702 generally includes representations of one or more additional or intermediate layer structures that are created and used during design verification. Such layers can include, for example, layers associated with phase mask pattern features and chrome mask pattern features. Some designs include only a single layer, but an associated hierarchical database can include one or more intermediate layers.

In some examples, importation of source data into a hierarchical database includes executing hierarchical injection such as homogeneous injection, overlap injection, bin injection, or other injection process. Homogeneous injection typically generates a hierarchical representation for designs that include a plurality of similar cells. In some examples, the similar cells are aligned with respect to each other and can be grouped into new cells. Homogeneous injection is typically applied to a variety of designs, and can be particularly effective with designs for memory arrays. In overlap injection, a hierarchical representation is generated based on repeated patterns that are placed so that the patterns interact. In bin injection, flat cells are subdivided based on geometric bins, each of which can become a new cell. For example, a design portion that includes a variety of features can be subdivided based on a regular or irregular grid, so that grid sectors define cells. In general, hierarchical injection involves identification of recurring patterns of cell placements and replacement with new cells. Injection processes can be configured for automatic execution, or one or more types of injection can be manually specified for particular design portions. In one embodiment, specially designed heuristics are used to recognize patterns and to determine a selected representation as new cells. Various importation techniques are described in Grodd, "PLACEMENT BASED DESIGN CELLS INJECTION INTO AN INTEGRATED CIRCUIT DESIGN," U.S. patent application Ser. No. 09/234,030, filed Jan. 19, 1999.

Figure 7D:
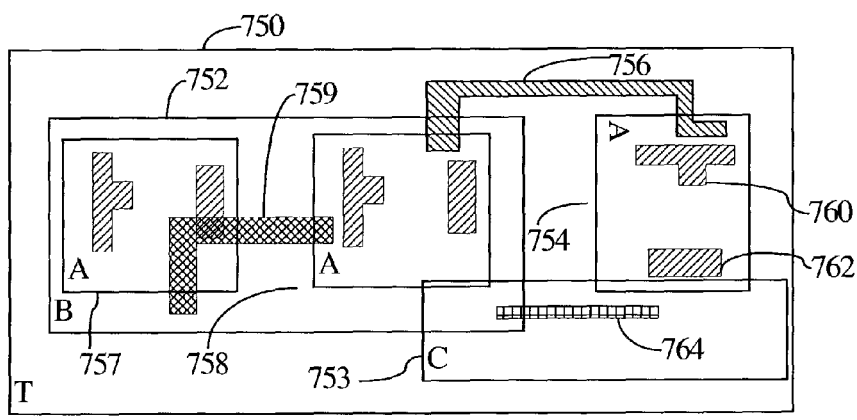
FIG. 7D is a schematic diagram illustrating hierarchical layout data.
Figure 7E:
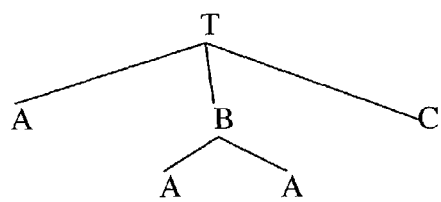
FIG. 7E is a hierarchy tree associated with the layout of FIG. 7B.
Figure 7B:
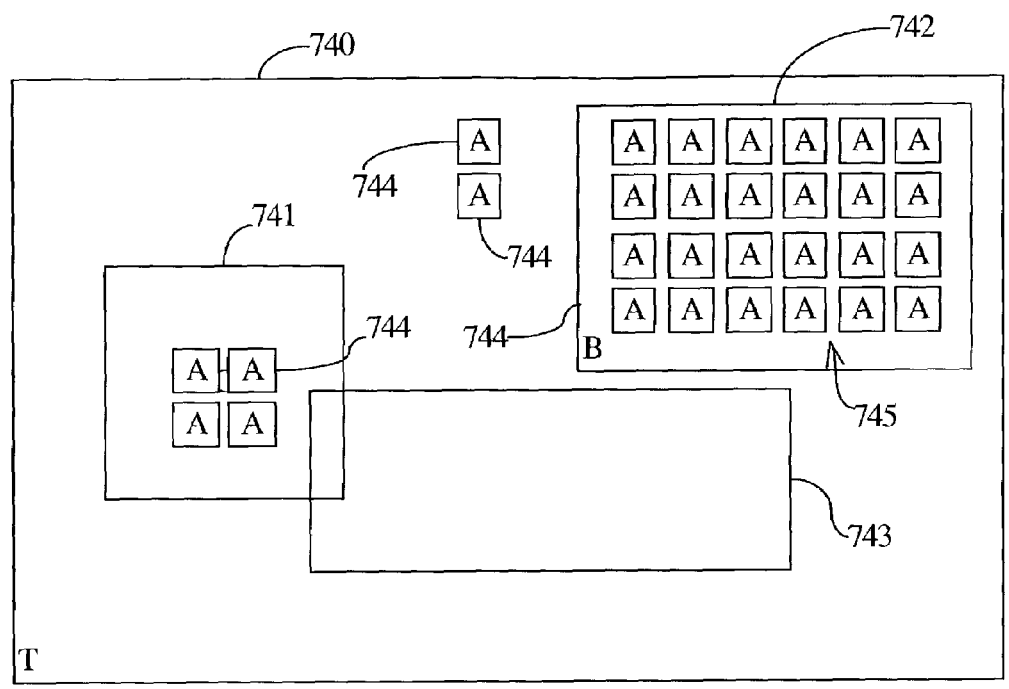
FIG. 7B is a schematic diagram illustrating hierarchical layout data.
Figure 7C:
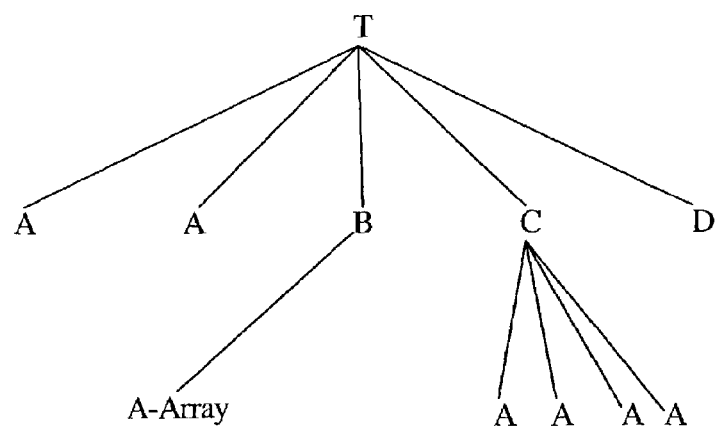
FIG. 7C is a hierarchy tree associated with the layout of FIG. 7B.

FIG. 7B and FIG. 7D illustrate a layout data portion arranged in a hierarchical database. The layout portion of FIG. 7B includes a top level cell (T) 740 that includes second layer cells 741, 742, 743 (marked as "B," "C," "D," respectively) and two similar cells 744 (marked as "A"). The second layer cell 741 includes four cells 744 and the second layer cell 742 includes an array 745 of cells and the second layer cell 741 includes four cells 747–750. FIG. 7C illustrates a hierarchical relationship of cells corresponding to the layout data portion of FIG. 7C.

The layout data portion of FIG. 7D includes a top level cell 750 that includes second level cells 752, 753, 754 and a layout feature 756. The second level cell 752 includes third level cells 757, 758 that contain the same features as the cell 754 and a layout feature 759. The second level cell 754 (and other similar cells, at this or other hierarchical levels) includes layout features 760, 762 and the second level cell 753 includes a layout feature 764. FIG. 7E is a corresponding hierarchy tree.

As shown in FIG. 7A, the hierarchical database 702 is configured for access by layout verification tools such as a layout versus schematic (LVS) tool 708, a design rule check (DRC) tool 710, an optical rule checking (ORC) tool 712, a phase-shift mask (PSM) tool 714, and an optical process correction (OPC) tool 716 that are configured to verify that transformation to a physical layout has not introduced errors, and that the final layout is in compliance with appropriate geometric design rules or other design rules. Use of such tools permits identification of errors in the hierarchical representation of the layout before mask generation and/or wafer fabrication. Additional tools that communicate with the hierarchical database 702 can be provided, or fewer tools can be provided. The OPC tool 716 can be configured to correct or compensate optical proximity effects, image distortions, and other process related effects. In addition, lithographic size descriptors and associated ranges can be stored in a database 725 or in the hierarchical database 702.

The tool 700 also includes a data export component 718 configured to provide data to a circuit manufacturing process 720. As shown in FIG. 7, the tools 708, 710, 712, 714 process data obtained from the hierarchical database 702, but in other examples, such processes can be configured to extract and store necessary data using one or more tool-specific databases.

The tool 700 can be implemented using a workstation, personal computer, one or more network computers, or other computer systems. The hierarchical database 702 is generally stored on a hard disk, floppy disk, magnetic tape, CD-ROM or other storage media. The hierarchical database 702 can be stored with storage media associated with a selected workstation or personal computer, or can be stored on a storage device that is accessible via a network. Tools such as the tools 708, 710, 712, 714 can be implemented as software components that include a series of computer-executable instructions that are stored in a computer readable medium or can be integrated or partially integrated.

The DRC tool 710 can be configured to verify that design data adheres to a set of design rules that are generally to avoid process regions for which pattern transfer fidelity is inadequate to provide acceptable device performance or process yield. The DRC tool 710 can also be configured to identify design features that can be successfully realized using OPC, and the ORC tool 712 can be configured to identify design areas having potentially unacceptable device performance and/or process yield. Typically the ORC tool 712 compares predicted manufacturing results with an IC design based on a calculation of edge placement error (EPE). Large EPEs typically indicate problem areas. Common problems encountered include control of linewidth due to dependence of linewidth on a local density of pattern features. As a result, lines having the same design width appear with different widths on manufactured devices. Another common problem is a pullback of line ends from a design location. Thus, lines do not end where expected. Because the loss of pattern fidelity associated with linewidth control and line end pullback are repeatable and predictable, the OPC tool 716 can be configured to compensate these effects. For example, the OPC tool can be configured to compensate based on designer input, or iteratively based on process simulation, or on one or more design rules.

Figure 8:
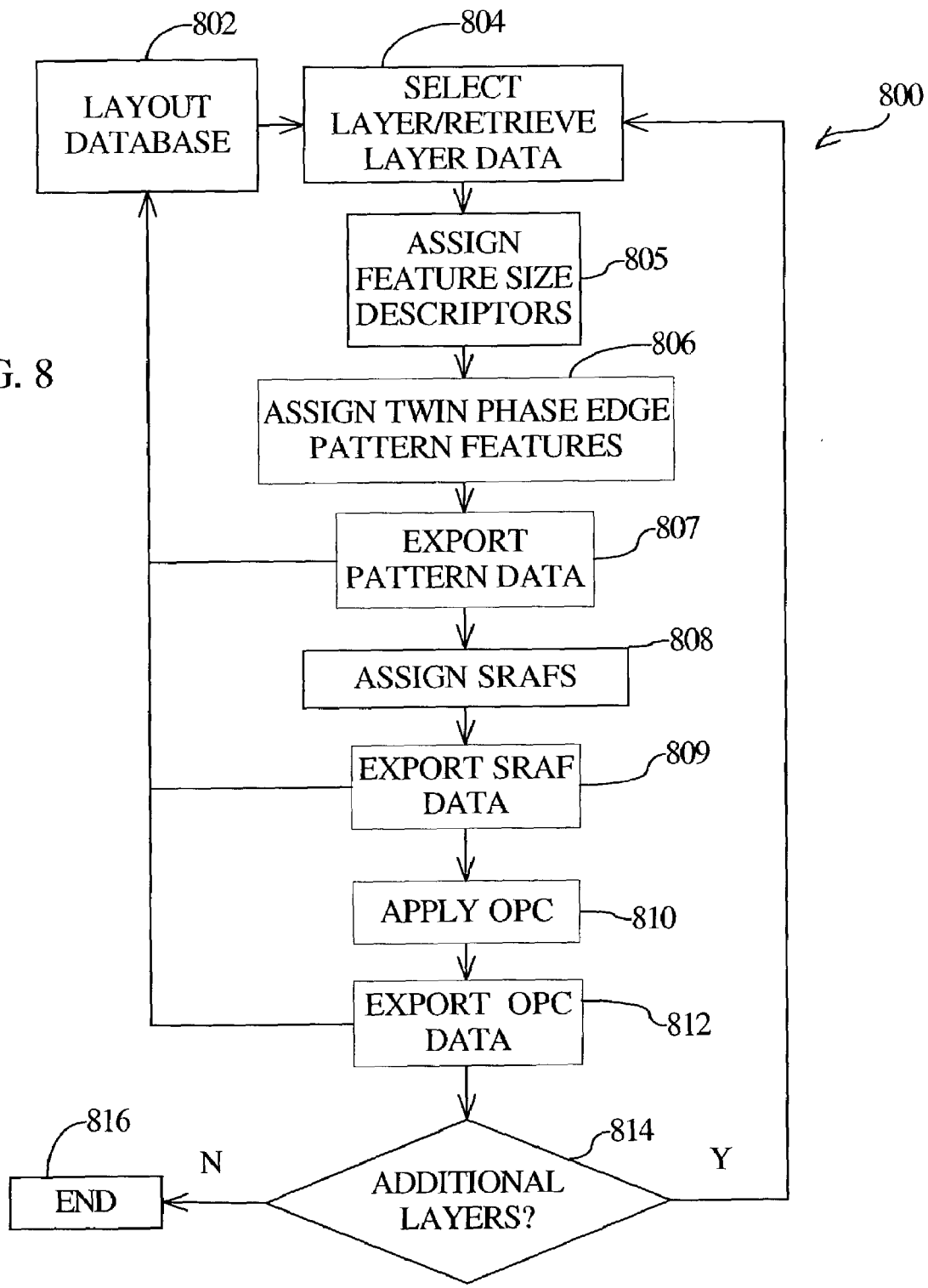
FIG. 8 is a schematic block diagram of a method of configuring CPL layout data.

Execution of a representative PSM tool 800 is illustrated schematically in FIG. 8. In a step 804, a layer is selected and data associated with the layer is retrieved from a layout database 802. In a step 805, lithographic size descriptors associated with one or more feature size ranges are assigned to one or more features of the selected layer. In a step 806, mask features are assigned to the selected features based on the assigned lithographic size descriptors. For CPL, at least some mask features are assigned twin phase-edge pattern data that can be exported to the layout database 802 in a step 807 along with, if needed, the associated lithographic size descriptors. In a step 808, SRAFs are assigned based on the previously assigned lithographic size descriptors. In some examples, SRAFs are assigned only to features associated with selected lithographic size descriptors. SRAF data is exported to the layout database 802 in a step 809. As shown in FIG. 8, the PSM tool 800 can be configured to provide OPC-related feature corrections in a step 810 and associated data exported in a step 812. After processing a selected layer, a control block 814 determines if additional layers are to be processed. If so, processing control returns to the step 804, otherwise, an end block 816 is executed.

Although the PSM tool 800 is configured to provide both OPC and SRAF data, in other examples, OPC and/or SRAF data can be generated using other tools, and the PSM tool 800 can be configured to generate chrome layer mask pattern data or other mask pattern data in addition to chromeless data. The PSM tool 800 typically assigns twin phase-edge pattern features based on the size descriptor, and these pattern features are exported to the layout database 802, but in some examples, size descriptors are not used. In some examples, chromeless mask data is processed using OPC or including SRAFs prior to data export to the layout database 802.

Figure 9:
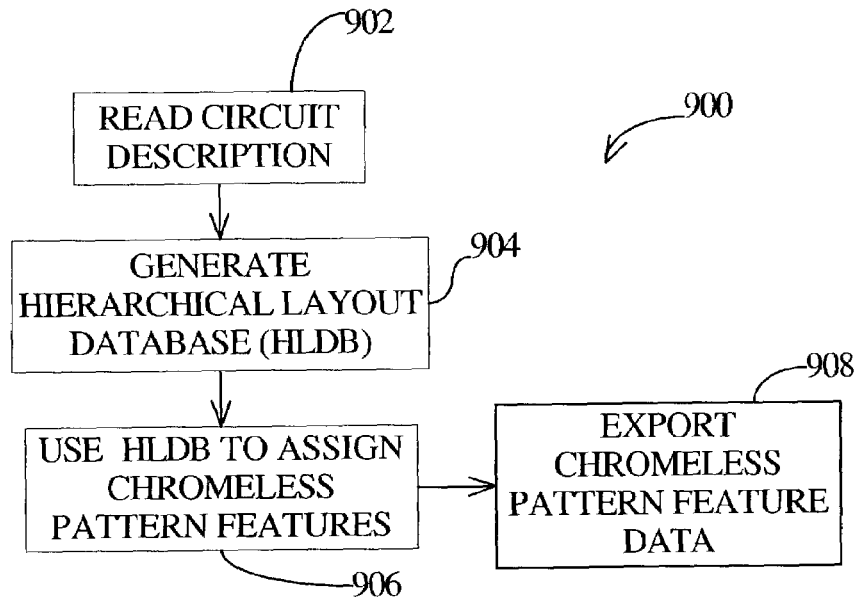
FIG. 9 is block diagram of a method 900 of generating chromeless mask data.

With reference to FIG. 9, a method 900 of generating chromeless mask data includes reading a circuit description in a step 902 and generating a hierarchical layout database in a step 904. Based on pattern feature data in the hierarchical layout database, chromeless mask data is assigned in a step 906. In a step 908, chromeless mask data is exported to the hierarchical layout database in a step 908.

Figure 10:
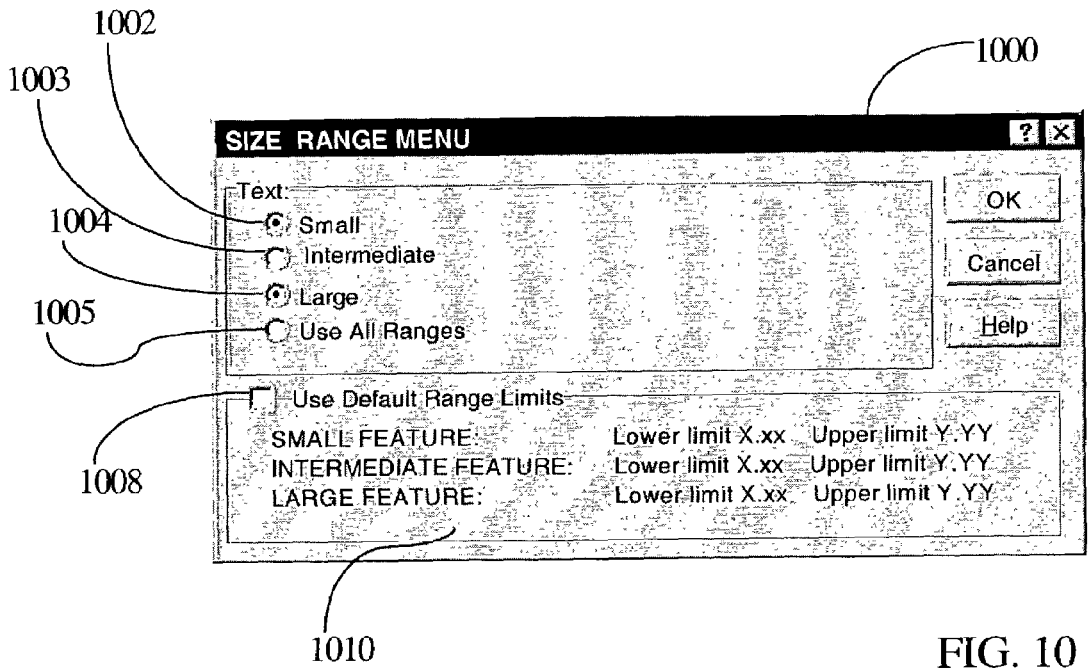
FIG. 10 is a schematic diagram of a menu configured for selection of feature size ranges and associated range limits.

Lithographic size ranges can be provided to the PSM tool 800 using a computer system having a graphical user interface. Size range bounds can be entered, and lithographic size ranges can be selected using the graphical user interface using a mouse or other input device and a display that presents an associated menu. Size range bounds can be supplied using a keyboard or other input device, or selected from list or menu of available size range bounds. With reference to FIG. 10, a menu 1000 includes indicator buttons 1002, 1003, 1004, 1005, 1006 associated with selection of a small size range, an intermediate size range, a large size range, or all size ranges, respectively. Default range limits can be selecting using an indicator button 1008, and range limits can be entered using a keyboard in menu area 1010.

Figure 11:
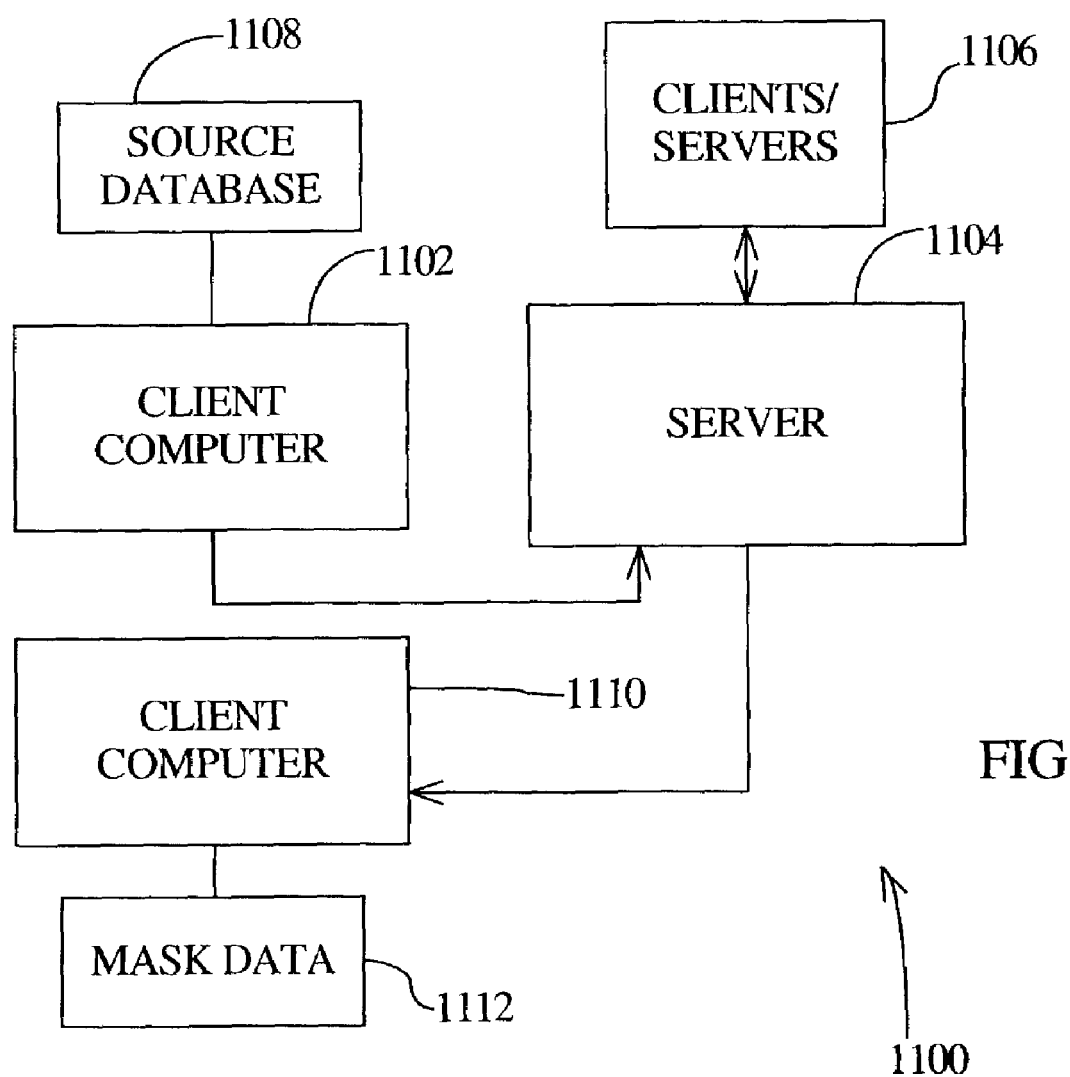
FIG. 11 is a schematic diagram of a computing environment.

With reference to FIG. 11, a representative computing environment 1100 includes a first client computer 1102, a server 1104, a second client computer 1110, and one or more additional client computers/servers 1106. The first client computer 1102 is configured to deliver integrated circuit design data stored in a source database 1108 to the server 1104 that returns mask data to a second client computer 1110 for stored in a mask or other database 1112. Mask data can be produced and verified using one or more tools at the server 1104, or at one or more of the additional clients/servers 1106. For example, various process tools can be distributed to several client computers that can be remotely located from the client computer 1102. Alternatively, process tools can be located at a single client computer, or data can be transmitted by a single client computer to a server, and processed data returned to the client computer.

For convenience, methods and apparatus are described above with reference to circuit manufacturing and especially integrated circuit manufacturing. In other examples, such methods and apparatus are used in fabrication of other devices that are fabricated using photolithographic pattern transfer. For example, Micro Electro-Mechanical Systems (MEMS), biochips for DNA sequencing or other applications, or integrated optical devices such as, for example, planar waveguides, fiber Bragg gratings, and photonic crystals can also be fabricated using such methods and apparatus. In addition, methods and apparatus are described above with reference to chromeless masks but in some examples, some mask portions include chrome or other opaque materials configured to define some pattern features or for other purposes. The term "twin" phase edges generally refers to phase edges that are placed so that images of the phase edges merge or partially merge. Such phase edges are not necessarily identical and can be non-parallel, non-linear, have different edges profiles, or other differences. The above examples are described with reference to masks or photomasks, and the disclosed lithographic methods, apparatus, and masks are typically configured for use in projection optical systems, wherein the term reticle is also used. For purposes of this disclosure, mask and reticle are synonymous.

The invention has been described with reference to numerous examples, but it will be apparent to those skilled in the art that these examples can be altered in arrangement and detail. We claim all that is encompassed by the appended claims.

We claim:

1. A layout processing method, comprising:
   obtaining data for at least one feature from a layout database;
   assigning a lithographic size identifier to the at least one feature;
   associating twin phase-edge pattern data with the at least one feature based on the assigned lithographic size identifier; and
   exporting the twin phase-edge pattern data to the layout database.

2. The method of claim 1, further comprising:
   reading an initial layout representation; and
   creating the layout database based on the initial layout representation, wherein the layout database is a hierarchical database.

3. The method of claim 1, further comprising:
   associating data for at least one sub-resolution assist feature with the at least one feature, wherein the sub-resolution assist feature data is selected based on the lithographic size identifier; and
   exporting the associated sub-resolution assist feature data to the layout database.

4. The method of claim 3, wherein the lithographic size identifier is associated with an intermediate design feature size range.

5. The method of claim 4, further comprising
   retrieving at least one characterization parameter associated with a photolithographic process model; and
   configuring the phase-edge pattern data and the sub-resolution assist feature pattern data based on the at least one characterization parameter.

6. The method of claim 1, wherein the lithographic size identifier is associated with a large design feature size range.

7. The method of claim 6, further comprising associating mask pattern data associated with a plurality of phase edges with the at least one feature.

8. The method of claim 7, further comprising:
   retrieving at least one characterization parameter based a photolithographic process model; and
   configuring the mask pattern data for the plurality of phase edges based on the at least one characterization parameter.

9. The method of claim 7, further comprising associating sub-resolution assist feature data with the at least one feature.

10. The method of claim 1, wherein the lithographic size identifier is associated with a minimum design feature size range.

11. The method of claim 1, further comprising performing model-based optical process correction on the twin phase-edge pattern data.

12. A computer-readable medium comprising computer-executable instructions that when executed cause a computer to perform a method of layout processing including:
    obtaining data for at least one feature from a layout database;
    assigning a lithographic size identifier to the at least one feature;
    associating twin phase-edge pattern data with the at least one feature based on the assigned lithographic size identifier; and
    exporting the twin phase-edge pattern data to the layout database.

13. The computer-readable medium of claim 12, wherein the instructions further cause the computer to:
    read an initial layout representation; and create the layout database based on the initial layout representation, wherein the layout database is a hierarchical database.

14. The computer-readable medium of claim 12, wherein the instructions further cause the computer to:
associate data for at least one sub-resolution assist feature with a feature, wherein the sub-resolution assist feature data is selected based on the lithographic size identifier assigned to the associated feature; and
export the associated sub-resolution assist feature data to the layout database.

15. The computer-readable medium of claim 14, wherein the instructions further cause the computer to:
associate a lithographic size identifier with an intermediate design feature size range.

16. The computer-readable medium of claim 15, wherein the instructions further cause the computer to:
retrieve at least one characterization parameter associated with a photolithographic process model; and
configure the twin phase-edge pattern data and the sub-resolution assist feature pattern data based on the at least one characterization parameter.

17. The computer-readable medium of claim 12, wherein the instructions further cause the computer to:
associate a lithographic size identifier with a large design feature size range.

18. The computer-readable medium of claim 17, wherein the instructions further cause the computer to:
associate mask pattern data with a plurality of phase edges with the at least one feature.

19. The computer-readable medium of claim 18, wherein the instructions further cause the computer to:
retrieve at least one characterization parameter based a photolithographic process model; and
configure the mask pattern data for the plurality of phase edges based on the at least one characterization parameter.

20. The computer-readable medium of claim 18, wherein the instructions further cause the computer to:
associate sub-resolution assist feature data with the at least one feature.

21. The computer-readable medium of claim 12, wherein the instructions further cause the computer to:
associate a lithographic size identifier with a minimum design feature size range.

22. The computer-readable medium of claim 12, wherein the instructions further cause the computer to:
perform model-based optical process correction on the twin phase-edge pattern data.

23. A layout processing method, comprising:
assigning lithographic size identifiers to a plurality of features defined in a layout database, wherein the lithographic size identifiers are associated with a minimum size range, an intermediate size range, and a large size range; and
assigning twin phase-edge mask pattern data to the features based on the assigned lithographic size identifiers.

24. A method of processing a circuit layout, comprising:
obtaining layout data from a layout database;
processing the layout data to identify layout features based on a minimum size range, an intermediate size range, and a large size range;
assigning twin phase-edge mask pattern data to at least one layout feature identified with the minimum size range; and
exporting the twin phase-edge mask pattern data to the database.

25. The method of claim 24, further comprising assigning sub-resolution assist feature data to at least one layout feature identified with the intermediate size range.

26. The method of claim 24, further comprising associating a plurality of phase edges to at least one layout feature identified with the large size range.

27. The method of claim 24, further comprising associating mask feature data for a substantially opaque mask region to at least one layout feature identified with the large size range.

28. The method of claim 24, further comprising associating mask feature data for a substantially opaque mask region to at least one layout feature identified with the intermediate size range.

29. The method of claim 24, further comprising performing model-based optical process correction on the twin-edge mask-pattern data.

30. A computer-readable medium comprising computer-executable instructions that when executed cause a computer to perform a method of processing a circuit layout by:
obtaining layout data from a layout database;
processing the layout data to identify layout features based on a minimum size range, an intermediate size range, and a large size range;
assigning twin phase-edge mask pattern data to at least one layout feature identified with the minimum size range; and
exporting the twin phase-edge mask pattern data to the database.

31. The computer-readable medium of claim 30 further comprising computer-executable instruction that cause a computer to:
assign sub-resolution assist feature data to at least one layout feature identified with the intermediate size range.

32. The computer-readable medium of claim 30, wherein the instructions further cause the computer to:
associate a plurality of phase edges to at least one layout feature identified with the large size range.

33. The computer-readable medium of claim 30, wherein the instructions further cause the computer to:
associate mask feature data for a substantially opaque mask region to at least one layout feature identified with the large size range.

34. The computer-readable medium of claim 30, wherein the instructions further cause the computer to:
associate mask feature data for a substantially opaque mask region to at least one layout feature identified with the intermediate size range.

35. The computer-readable medium of claim 30, wherein the instructions further cause the computer to:
perform model-based optical process correction on the twin phase-edge mask-pattern data.

36. A method of processing layout data for the creation of one or more photolithographic masks, comprising:
reading layout data that define one or more features to be created on a semiconductor wafer with a photolithographic process;
determining a size of one or more of the features and associating a size identifier with the features based on their determined size;
for one or more of the features that are associated with a size identifier, selecting a pattern of twin-phase edge data that defines one or more phase shifters for use on a mask that will create the corresponding feature on the wafer when exposed during the photolithographic process, wherein the pattern of twin-phase edge data is selected based on the size identifier associated with the feature; and storing the patterns of selected twin-phase edge data as mask data for use in creating the one or more photolithographic masks.

37. The method of claim 36, wherein some of the features in the layout data are identified as being small sized and the pattern of twin-phase edge data selected for features associated with a small size identifier defines a single chromeless phase shifting.

38. The method of claim 36, wherein some of the features in the layout data are identified as being medium sized features and the pattern of twin-phase edge data selected for features associated with a medium size identifier defines two subresolution assist features positioned on two sides of a center region.

39. The method of claim 36, wherein some of the features in the layout data are identified as being large sized features and the pattern of twin-phase edge data selected for features associated with a large size identifier defines a pattern of alternating phase shifting regions.

40. A computer-readable media including a sequence of instructions that is executable by a computer to perform a method of processing layout data for the creation of one or more photolithographic masks, by:

reading layout data that define one or more features to be created on a semiconductor wafer with a photolithographic process;

determining a size of one or more of the features and associating a size identifier with the features based on their determined-size;

for one or more of the features that are associated with a size identifier, selecting a pattern of twin-phase edge data that defines one or more phase shifters for use on a mask that will create the corresponding feature on the wafer when exposed during the photolithographic process, wherein the pattern of twin-phase edge data selected is based on the size identifier associated with the feature; and storing the patterns of selected twin-phase edge data as mask data for use in creating the one or more photolithographic masks.

41. The computer-readable media of claim 40, wherein some of the features in the layout data are identified as being small and wherein the instructions include instructions for selecting a pattern of twin-phase edge data defining a single chromeless phase shifting region for features that are associated with a small size identifier.

42. The computer-readable media of claim 40, wherein some of the features in the layout data are identified as being medium sized and wherein the instructions include instructions for selecting a pattern of twin-phase edge data that defines two subresolution assist features positioned on two sides of a center region for features that are associated with a medium size identifier.

43. The computer-readable media of claim 40, wherein some of the features in the layout data are identified as being large sized features and wherein the instructions include instructions for selecting a pattern of twin-phase edge data that defines a pattern of alternating phase shifting regions for features associated with a large size identifier.

44. A method of generating mask pattern data, comprising:

selecting at least one pattern portion from a layout database;

selecting a phase-edge density;

associating a plurality of phase edges with the pattern portion based on the selected phase-edge density; and, exporting twin phase-edge mask pattern data associated with the plurality of phase edges to the layout database.

45. The method of claim 44, wherein the phase-edge density is a directional phase-edge density associated with phase-edge densities along two coordinate axes.

46. The method of claim 45, wherein the phase-edge density is variable.

47. The method of claim 46, wherein the phase-edge density is selected based on a size of the selected feature.

48. The method of claim 44, wherein the phase-edge density is selected based on a predetermined process window for the selected feature.

49. The method of claim 44, wherein the phase-edge density is selected based on a predetermined process window for a feature other than the selected feature.

50. The method of claim 44, further comprising adjusting the phase-edge density based on a pattern-transfer process characterization.

51. The method of claim 44, further comprising performing model-based optical process correction on at least a portion of the mask-pattern data.

* * * * *